United States Patent [19]
Johnson

[11] Patent Number: 5,144,410
[45] Date of Patent: Sep. 1, 1992

[54] OHMIC CONTACT FOR III-V SEMICONDUCTOR DEVICES

[75] Inventor: David A. Johnson, Camarillo, Calif.

[73] Assignee: Vitesse Semiconductor Corporation, Camarillo, Calif.

[21] Appl. No.: 702,151

[22] Filed: May 14, 1991

Related U.S. Application Data

[63] Continuation of Ser. No. 331,250, Mar. 29, 1989, abandoned.

[51] Int. Cl.$^5$ .................. H01L 21/06; H01L 21/12
[52] U.S. Cl. .................................... 357/63; 357/67
[58] Field of Search ............... 357/67, 63, 17, 15, 357/61, 71, 64

[56] References Cited

U.S. PATENT DOCUMENTS

| | | | |
|---|---|---|---|
| 3,914,785 | 10/1975 | Ketchow | 357/63 |
| 4,001,056 | 1/1977 | Groves et al. | 357/63 |
| 4,188,710 | 2/1980 | Davey et al. | 357/67 |
| 4,632,713 | 12/1986 | Tiku | 357/15 |

FOREIGN PATENT DOCUMENTS

| | | | |
|---|---|---|---|
| 2844257 | 4/1979 | Fed. Rep. of Germany | 357/63 |
| 54-152481 | 11/1979 | Japan | 357/67 |
| 54-152486 | 11/1979 | Japan | 357/67 |

OTHER PUBLICATIONS

"Electrical and Structural Properties of W-In Based Ohmic Contacts to GaAs"—Dutta et al., Solid State Electronics, vol. 33, No. 12, pp. 1601-1604.

"Laser Annealed Ta/Ge and Ni/Ge Ohmic Contacts to GaAs"—Anderson et al.—IEEE Electron Device Letters, vol. EDL-2, No. 5, May 1981, pp. 115-117.

Primary Examiner—Rolf Hille
Assistant Examiner—S. V. Clark
Attorney, Agent, or Firm—Benman & Collins

[57] ABSTRACT

A dependable ohmic contact with consistently low specific contact resistance ($<1\times10^{-6}$ $\Omega$-cm$^2$) to n-type GaAs (10) is produced by a three or four step procedure. The procedure, which is employed following implantation to form doped regions in the GaAs substrate for contacting thereto, comprises:

(a) adsorbing or reacting sulfur or a sulfur-containing compound (26) with the GaAs surface (10') at locations where the contact metal (28) is to be deposited;

(b) forming a metal contact layer (28) on the treated portions of the GaAs surface;

(c) optionally forming a protective layer (30) over the metal contact; and (d) heating the assembly (metal and substrate) to form the final ohmic contact. The surface treatment provides a lower specific contact resistance of the ohmic contact. Elimination of gold in the ohmic contact further improves the contact, since intermetallic compounds formed between gold and aluminum interconnects ("purple plague") are avoided. In addition, the absence of gold in the metal improves the reliability of ohmic contacts, and the resulting metal can be patterned by etching or lift-off process.

12 Claims, 1 Drawing Sheet

OHMIC CONTACT FOR III-V SEMICONDUCTOR DEVICES

This is a continuation of co-pending application Ser. No. 07/331,250 filed on Mar. 29, 1989, now abandoned.

TECHNICAL FIELD

The present invention relates broadly to III-V semiconductor devices, and, in particular, to an improved ohmic contact to such devices.

BACKGROUND ART

Low resistance, linear (current-voltage relationship) contact to n-type GaAs is traditionally done with a Au/Ge/Ni metallurgy. Although commonly used, this metallurgy has several disadvantages. First, it contains gold, which forms an intermetallic compound with aluminum, a metal useful as an interconnect metal. Second, the contact resistivity of the contact degrades when exposed to temperatures near or above its alloying temperature (about 450° C.), and thus the contact is degraded by any high temperature process step following contact formation. Third, metallic phase and/or alloy segregation occurs upon contact formation, thus limiting the minimum size of the contact.

Low contact resistance ($R_c$) ohmic contacts to GaAs have been produced with Ni and Ge that do not evidence the above problems, but these processes involve growing Ge epitaxially on GaAs, which is not compatible with present GaAs LSI (large scale integration) processes.

Pd/Ge and Ni/Ge ohmic contacts have been formed on GaAs by sputtering and then sintering, but the contact resistance values of contacts using these metallurgies are about 10 to 100 times that of the best Au/Ge-based contacts, and there is evidence that these contacts experience an increase in contact resistance of about 5 to 10 times for prolonged aging cycles above 450° C.

DISCLOSURE OF INVENTION

A dependable ohmic contact with consistently low specific contact resistance ($<1\times10^{-6}$ $\Omega-cm^2$) to n-type GaAs is produced by a three or four step procedure. The procedure comprises:

(a) adsorbing or reacting a Group VI element or a compound containing a Group VI element with the GaAs surface at locations where the contact metal is to be deposited to form a modified GaAs surface;

(b) forming an ohmic metal contact layer on the modified portions of the GaAs surface; and (c) heating the assembly (metal and substrate) to form the final ohmic contact.

Optionally, a step comprising forming a protective layer over the metal contact may be inserted before heating the assembly.

The altered surface of the semiconductor results in an improved ohmic contact. While n-type ohmic contacts of any metallurgy are improved by the practice of the invention, use of a non-gold containing contact provides additional benefits, such as affording an ohmic contact that does not react with aluminum interconnect metals to form the well-known "purple plague" intermetallic. In addition, the absence of gold in the metal contact improves the reliability of ohmic contacts, and the resulting metal is easier to etch than gold-containing metallizations.

BEST MODES FOR CARRYING OUT THE INVENTION

Although the following description refers to GaAs as the semiconductor material, the invention is equally useful in other III-V semiconductor devices, because of their similar ohmic contact requirements.

Figure 1:
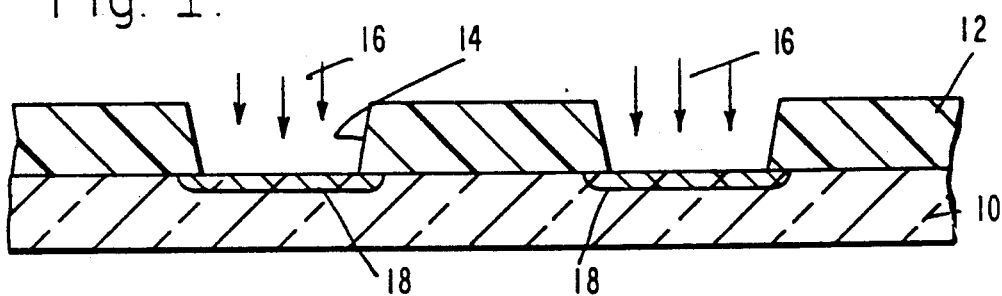
FIGS. 1-5 depict, in cross-sectional view, the sequence of steps in forming the contact of the invention.

The process of the invention is employed after defining active areas and performing an implant therein. As shown in FIG. 1, a GaAs substrate 10 is provided with a dielectric layer or photoresist layer 12, in which openings 14 are defined for formation of active areas. The thickness of the dielectric layer or photoresist layer 12 and the dimensions of openings 14 are those conventionally employed in the prior art. Well-known insulating layers such as silicon dioxide and silicon nitride are conveniently employed for the dielectric layer.

An implant of a desired dopant species is performed, as indicated by arrows 16, to form an implant region 18 in each active area. For n-type implants, silicon or selenium ions are implanted. Such active area definition and implant procedures are well-known in the art and do not form a part of this invention.

Figure 2:
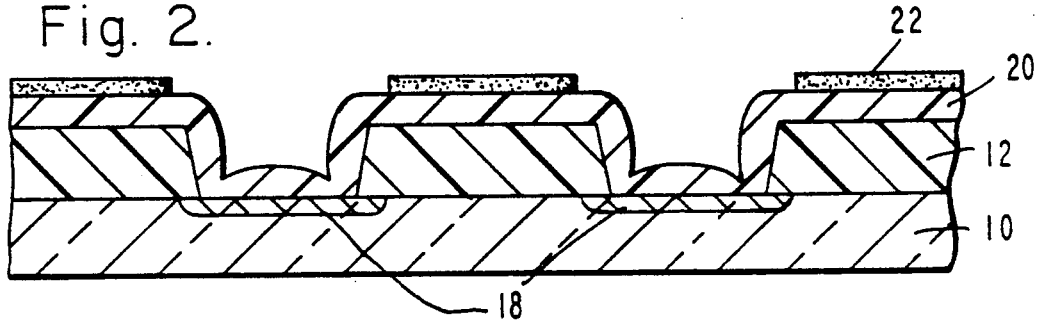

Following ion implantation, a dielectric layer 20 is deposited everywhere, as shown in FIG. 2. This dielectric, which is used in the conventional contact metallization lift-off process, briefly described below, is about the same thickness as the total contact metal thickness. A photoresist layer 22 is deposited over the dielectric layer 20 and is patterned to expose those portions of the dielectric layer overlying the active areas.

Figure 3:
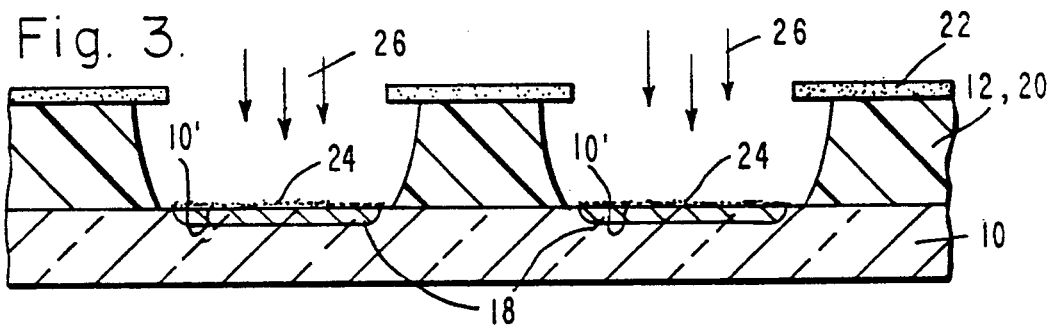

As depicted in FIG. 3, the exposed portions of the dielectric layer 20 are etched away, to expose the active regions. The photoresist 22 is undercut slightly to ensure discontinuity between metal deposited on the photoresist and metal deposited in the active region, to aid in the lift-off procedure, as is well-known.

The active regions are next treated by the process of the invention to form an improved contact, which includes forming a Group VI-containing surface layer 24 on the exposed portions of the semiconductor surface 10'.

The first step of the procedure of the invention involves adsorbing, implanting, or reacting sulfur or sulfur-containing compounds to (with) those portions of the n-type semiconductor surface 10' where the ohmic contact is to be formed. This step is most easily achieved by exposing portions of the semiconductor to an $SF_6$ plasma, indicated by arrows 26, as shown in FIG. 3, as it is produced in a plasma or RIE (reactive ion etching) etcher. Other methods may involve plasma-enhanced chemical vapor deposition (CVD), reactive sputtering, low pressure CVD, or exposure to a sulfur-containing liquid or gas. Other Group VI elements, such as Se or Te may behave like sulfur (S) in this application, and thus may be substituted for it, given the appropriate conditions.

The amount/depth of sulfur necessary in the practice of the invention is in the range of that achievable by a 10 to 60 second exposure to a $SF_6$ plasma with the following approximate parameter ranges: pressure=50 to 500 mTorr, power=10 to 100 W/cm$^2$, $SF_6$ flow—5 to 50 sccm/3 inch wafer. The depth is probably limited to a few monolayers at the surface. A conventional plasma etcher may be employed. Other procedures for introducing the Group VI species may be followed, so long as the concentration achieved is comparable to that achieved under the conditions described. Further, any other gasses that aid in the adhesion or penetration of the sulfur (or other Group VI species) on or into, respectively, the GaAs surface or that aid in the ignition of the $SF_6$ plasma may be employed.

The second step of the procedure may be achieved by any metal deposition method, such as those commonly used in the semiconductor industry, e.g., sputter deposition, evaporation, etc. Using appropriate techniques for the first and this second step, it is conceivable that both steps may be combined into one.

Any metal contact that forms an ohmic contact with GaAs will be improved by the practice of the invention. However, non-auric-containing contacts, such as the well-known nickel/germanium metal contact, are considerably improved over auric-containing contacts, and hence are most desirably employed in the practice of the invention. Further, the surface treatment provided by the invention permits use of a Ni/Ge contact without requiring the presence of gold, thereby eliminating problems with aluminum interconnect metals (the well-known "purple plague" intermetallic). In addition, the absence of gold in the metal contact improves the reliability of ohmic contacts, and the resulting metal is easier to etch than gold-containing metallizations.

Figure 4:
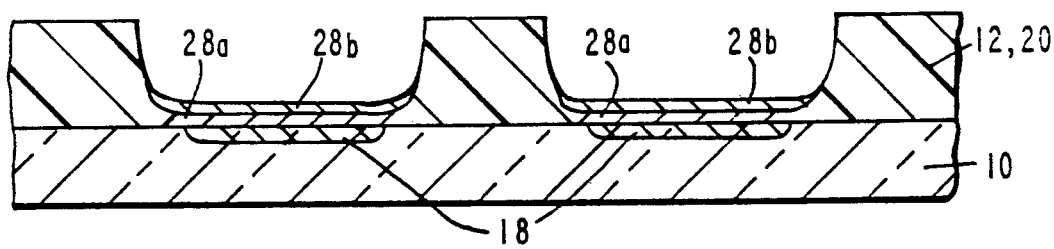

Germanium and nickel layers 28a and 28b, respectively, are sequentially deposited onto those areas of the semiconductor wafer that have received the Group VI surface treatment, as shown in FIG. 4, although methods of forming the Ge/Ni contact, such as simultaneous deposition of the two metals, may alternatively be employed.

The invention typically employs approximately equal parts of Ge and Ni, but is not limited to these proportions. The optimum total thickness of the bilayer depends on other process parameters such as n-type implant energy, any semiconductor etching done, and subsequent process step temperatures, but a thickness of the metal contact 28 of about 700 to 1,400 Å works well with typical process parameters.

Additionally, barrier layers (not shown) may be added to the top surface of the metal contact so that further process steps do not react with the contact. For example, a $WN_x$ layer, having a thickness of about 500 to 1,000 Å, may be deposited on top of the metal contact, to act as a diffusion barrier against a subsequently-deposited aluminum interconnect. A thin nickel layer, having a thickness of about 100 Å, formed on top of the $WN_x$ layer keeps the $WN_x$ layer from being etched. Diffusion barriers are well-known in GaAs technology, and Ni is an element that is not easily plasma-etched.

The metal contact 28 may be patterned by any of the techniques common in the art. A preferred example of one such patterning step is the conventional lift-off process. However, an etching process (wet or dry) may alternatively be employed.

Although it is possible to form the contact by heating in a suitable ambient after the second step, it is more practical, in a manufacturing environment, to perform a third step to protect the contact, as now described.

Figure 5:
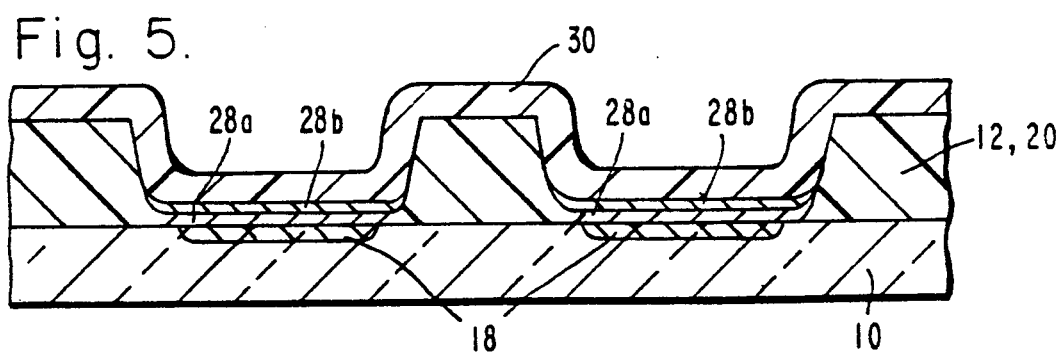

To keep the deposited metal and semiconductor from reacting with undesirable substances in the environment used in the fourth step, described below, and to keep any part of the semiconductor/metal sandwich from dissociating, a protective cap 30 is deposited over the sandwich, as shown in FIG. 5. The cap typically comprises a dielectric such as $Si_3N_4$ or $SiO_2$, but may also comprise any material that will not contaminate or react with the metal or sulfur-containing semiconductor. This step may be combined with the last step if the ambient of that step provides the above-stated requirements.

The minimum thickness of the protective cap 30 is governed by the diffusion length of the contaminating species, diffusion length of Ni and Ge, and the minimum pinhole-free dielectric film that may be deposited. Maximum film thickness depends on the stress of the deposited film and tolerance of subsequent deposition steps. For example, if the film is not etched all the way off in the process, step coverage of other films may become an issue. These considerations are well-known in the art, and the optimum thickness of the protective cap 30 is determinable without undue experimentation. In general, the thickness of the protective cap 30 may range from about 2 to 1,000 nm.

The final step in the formation of the ohmic contact in accordance with the invention involves heating the assembly (the metal and semiconductor). The maximum temperature of this heating step is typically about 500° to 600° C., but may vary depending on time duration of heating (often a function of heating equipment used), depth of n-type layer in the semiconductor, temperature of subsequent process steps, subsequent semiconductor etching steps, or other process parameter variations. The ambient around the structure during the high temperature step should be such that it does not interfere with the otherwise independent reaction between the sulfur treated semiconductor and the deposited metal layers.

Examples of suitable ambient gasses include (a) argon (if the heating step is performed in a completely enclosed tube), (b) forming gas (a mixture of $N_2$ and $H_2$) (if the heating step is performed in an open tube), and (c) $As_2$ if the protective layer 30 is thin or missing.

The heating time may range from about 5 to 60 minutes, although longer times may also be beneficially used. Shorter times, as short as about 30 seconds, may be used if appropriate heating equipment is used, such as rapid thermal annealing systems commonly employed in the industry.

One convenient approach is to slowly slide a quartz boat containing the processed wafer 10 into a preheated furnace tube. The speed that the boat is inserted depends on the effect of thermal shock on wafer/film stress (resulting in delamination, cracking, etc.) and is easily determinable.

Interconnects (not shown) are made to the metal contacts 28 by use of a via mask, etching vias in the protective cap 30, and depositing interconnects, such as aluminum or gold, and patterning the interconnects. Such interconnect formation is conventional in the prior art and forms no part of this invention.

Ion implantation to form n-doped regions 18 result in a surface concentration of the dopant of about $10^{13}$ to $10^{14}$ ions/$cm^2$. The surface treatment in accordance with the invention forms a thin film 24 (one to two monolayers) containing the Group VI species on the surface, providing about one to two orders of magnitude greater concentration than the dopant species thereon. It is this surface treatment that results in obtaining low resistance ohmic contacts 28 to the doped region 18 where none could be made before (e.g., Ni/Ge) or in obtaining ohmic contacts with improved resistance (e.g., Au/Ge).

It will be appreciated that other methods of defining the contact areas and contact metal, such as etching or photoresist lift-off, may also be applied to carry out the invention. Also, the protective cap 30 is not required, if the annealing ambient and heat cycles are controlled to prevent contamination, oxidation, or decomposition of the contacts.

INDUSTRIAL APPLICABILITY

The novel ohmic contact and the process for forming the same are expected to find use in the fabrication of GaAs and other III-V semiconductor devices.

EXAMPLES

Contact Formation:

Any attempts to form Ni/Ge contacts on n-GaAs having a contact resistance of less than about 5 ohm-mm were unsuccessful. However, by altering the surface of the n-doped regions of the GaAs substrate in accordance with the teachings of the invention, Ni/Ge contacts were easily formed having the desired resistance, e.g., as low as 0.06 ohm-mm. Such contacts were achieved by reacting sulfur with the exposed portions of active regions by subjecting the exposed portions to an $SF_6$ plasma in a Drytek 203 plasma etcher, under a pressure of 75 mTorr, at a flow of $SF_6$ of 50 sccm. In Table I below, the variation of contact resistance with power and time is listed.

TABLE I

| | Variation of Contact Resistance | |
|---|---|---|
| $SF_6$ treatment | | Contact Resistance (ohm-mm) |
| 1,000 W | 10 sec. | 0.17 |
| 500 W | 10 sec. | 0.48 |
| 250 W | 10 sec. | 1.77 |
| 250 W | 30 sec. | 1.86 |
| 250 W | 50 sec. | 1.50 |
| No $SF_6$ treatment | | $\geq 5.0$ |

Au/Ge contacts were more readily formed to GaAs, and in one run had a contact resistance of 0.39 ohm-mm without treatment of $SF_6$. In the same run, devices in which the active areas of the GaAs surface had been treated with $SF_6$ plasma, the contact resistance ranged from 0.18 to 0.24 ohm-mm. Similarly, in another run, the contact resistance ranged from 0.40 to 0.55 ohm-mm for devices with no $SF_6$ treatment, while the contact resistance ranged from 0.25 to 0.31 ohm-mm with $SF_6$ surface treatment. Thus, the $SF_6$ surface treatment reduced the AuGe contact resistance by almost a factor of two.

Comparative Data for Au/Ge and Ni/Ge Ohmic Contacts

Listed below is the ohmic contact resistance degradation data for five wafers run together in the same lot. The difference in the wafers is the contact metal scheme used. Wafers A-C used Ge/Ni and wafers D-E used Au/Ge for the contact metal. Other than the contact metal steps of the process, normal processing was used on each wafer.

In each instance, sulfur was reacted with the exposed portions of active regions by subjecting the exposed portions to an $SF_6$ plasma in a Drytek 203 plasma etcher, under a pressure of 75 mTorr, at a flow of $SF_6$ of 50 sccm, and for a time of 10 sec.

The data below is from three different stages in the experiment: after first interconnect metal etch; after a 100 hour bake at 250° C.; and after a 2 hour bake at 450° C. The aging cycles (bakes) were done in an open furnace tube with flowing nitrogen. The test structure used to derive the following data consisted of two 250 $\mu m \times 100$ $\mu m$ ohmic contact rectangles with a 10 $\mu m$ space between them. After finding the sheet resistance of the GaAs between the two contact metal rectangles, the contact resistance was extracted. The GaAs sheet resistance was calculated from two resistors of different dimensions. Forty-four ohmic contact structures and resistance pairs were tested on each wafer.

Table II below shows mean and sigma values for each of the five wafers. It also lists the parameter "yield" for each wafer. Yield is defined as the percent of structures with a contact resistance of less than 5.0 ohm-mm. Only the structures that met this limit were counted in the mean and sigma numbers.

TABLE II

| | | Mean Contact Resistance (ohm-mm) and Yield | | | | | | | | |
|---|---|---|---|---|---|---|---|---|---|---|
| | | First Test | | | Post 250° Bake | | | Post 450° Bake | | |
| Wafer | Type | Mean | Sigma | Yield | Mean | Sigma | Yield | Mean | Sigma | Yield |
| A | Ge/Ni | 0.192 | 0.029 | 98 | 0.181 | 0.027 | 98 | 0.378 | 0.050 | 98 |
| B | Ge/Ni | 0.179 | 0.026 | 98 | 0.175 | 0.022 | 98 | 0.378 | 0.044 | 98 |
| C | Ge/Ni | 0.297 | 0.644 | 98 | 0.294 | 0.650 | 98 | 0.463 | 0.025 | 95 |
| D | Au—Ge | 0.818 | 0.243 | 98 | 1.18 | 0.382 | 100 | 3.687 | 0.659 | 95 |
| E | Au—Ge | 1.206 | 0.387 | 95 | 1.52 | 0.460 | 95 | 3.558 | 0.988 | 89 |

From Table II, it is seen that the mean contact resistance of Ge/Ni is about one-tenth that of Au-Ge, even after aging at 450° C. for 2 hours. It is clear that the process of the invention produces a more reliable Ni/Ge contact.

Thus, there has been disclosed a novel ohmic contact for III-V semiconductor devices. It will be appreciated by those skilled in the art that various changes and modifications of an obvious nature may be made without departing from the spirit and scope of the invention, and all such changes and modifications are deemed to fall within the ambit of the invention, as defined by the appended claims.

What is claimed is:

1. A thermally stable, low contact-resistance ohmic contact for a III-V semiconductor device comprising an ohmic contact metal contacting a portion of a doped region of said III-V semiconductor, characterized in that the surface of said portion has a thin film comprising a surface treatment thereon comprising a Group VI species and having a depth below said surface of at most a few monolayers.

2. The contact of claim 1 wherein said Group VI element consists essentially of an element selected from the group consisting of sulfur, selenium, and tellurium.

3. The contact of claim 2 wherein said Group VI element consists essentially of sulfur.

4. The contact of claim 1 wherein said ohmic metal comprises germanium/nickel alloyed metal.

5. The contact of claim 1 wherein said III-V semiconductor material consists essentially of GaAs.

6. The contact of claim 5 wherein said portion of III-V semiconductor material is n-doped and wherein said Group VI element is formed on said surface of said portion.

7. A thermally stable, low contact-resistance ohmic contact for a GaAs semiconductor device comprising a germanium/nickel alloyed metal contacting a portion of a doped region of said GaAs semiconductor, characterized in that the surface of said portion has a thin film comprising a surface treatment thereon comprising a sulfur-containing species and having a depth below said surface of at most a few monolayers.

8. The contact of claim 7 wherein said region of GaAs semiconductor material is n-doped and said sulfur-containing surface is formed on said region.

9. A thermally stable, low resistance ohmic contact formed on a portion of a major surface of a III-V semiconductor substrate, said portion overlying a bulk doped region in said substrate, said contact made by a process comprising:
 (a) introducing a Group VI element onto the surface of a III-V semiconductor material at locations where said contact is to be deposited to thereby form a surface treatment on said surface and extending to a depth below said surface to a depth of at most a few monolayers;
 (b) forming a metal contact, capable of forming an ohmic contact to said III-V semiconductor, on said treated portions of said III-V surface;
 (c) forming a protective layer over said metal contact; and
 (d) heating said metal contact and said III-V semiconductor to form said low resistance ohmic contact.

10. A thermally stable, low resistance ohmic contact formed on a portion of a major surface of a GaAs semiconductor substrate, said portion overlying a bulk doped region in said substrate, said contact made by a process comprising:
 (a) introducing sulfur onto the surface of GaAs at locations where said contact is to be deposited to thereby form a surface treatment on said surface and extending to a depth below said surface of at most a few monolayers;
 (b) forming a germanium-nickel metal contact on said treated portions of said GaAs surface;
 (c) forming a protective layer over said metal contact; and
 (d) heating said metal contact and said GaAs semiconductor to form said low resistance ohmic contact.

11. A thermally stable, low resistance ohmic contact formed on a portion of a major surface of a III-V semiconductor substrate, said portion overlying a bulk doped region in said substrate, said contact made by a process comprising:
 (a) introducing a Group VI element onto the surface of a III-V semiconductor material at locations where said contact is to be deposited to thereby form a surface treatment on said surface and extending to a depth below said surface of at most a few monolayers;
 (b) forming a metal contact, capable of forming an ohmic contact to said III-V semiconductor, on said treated portions of said III-V surface; and
 (c) heating said metal contact and said III-V semiconductor to form said low resistance ohmic contact.

12. A thermally stable, low resistance ohmic contact formed on a portion of a major surface of a GaAs semiconductor substrate, said portion overlying a bulk doped region in said substrate, said contact made by a process comprising:
 (a) introducing sulfur onto the surface of GaAs at locations where said contact is to be deposited to thereby form a surface treatment on said surface and extending to a depth below said surface of at most a few monolayers;
 (b) forming a germanium-nickel metal contact on said treated portions of said GaAs surface; and
 (c) heating said metal contact and said GaAs semiconductor to form said low resistance ohmic contact.

* * * * *